(12) United States Patent
Koo et al.

(10) Patent No.: US 8,124,968 B2
(45) Date of Patent: Feb. 28, 2012

(54) NON-VOLATILE MEMORY DEVICE

(75) Inventors: June-mo Koo, Seoul (KR); Suk-pil Kim, Yongin-si (KR); Tae-Eung Yoon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 296 days.

(21) Appl. No.: 12/366,151

(22) Filed: Feb. 5, 2009

(65) Prior Publication Data
US 2009/0321878 A1  Dec. 31, 2009

(30) Foreign Application Priority Data
Jun. 26, 2008 (KR) .................. 10-2008-0061110

(51) Int. Cl.
*H01L 29/08* (2006.01)
(52) U.S. Cl. ....... 257/42; 257/4; 257/537; 257/E29.326; 257/E45.002
(58) Field of Classification Search .............. 365/148, 365/163; 257/2, 4, 5, 42, 467, 537, E45.002, 257/E45.003, E33.046, E29.17, E29.079, 257/E29.08, E29.326, E21.004; 438/54, 438/102, 103, 382, 385
See application file for complete search history.

(56) References Cited

U.S. PATENT DOCUMENTS

| 6,236,059 B1* | 5/2001 | Wolstenholme et al. ......... 257/3 |
| 6,579,760 B1* | 6/2003 | Lung ............................ 438/257 |
| 7,700,935 B2* | 4/2010 | Kim et al. ......................... 257/5 |
| 7,910,914 B2* | 3/2011 | Tanaka et al. .................... 257/5 |
| 2002/0081833 A1* | 6/2002 | Li et al. ......................... 438/622 |
| 2004/0002186 A1* | 1/2004 | Vyvoda et al. ................. 438/237 |
| 2005/0158950 A1* | 7/2005 | Scheuerlein et al. ......... 438/257 |
| 2006/0110877 A1* | 5/2006 | Park et al. ...................... 438/238 |
| 2006/0203541 A1* | 9/2006 | Toda ............................... 365/163 |
| 2006/0237756 A1* | 10/2006 | Park et al. ..................... 257/296 |
| 2007/0190722 A1* | 8/2007 | Herner .......................... 438/257 |
| 2008/0123390 A1* | 5/2008 | Kim et al. ...................... 365/148 |
| 2008/0265235 A1* | 10/2008 | Kamigaichi et al. .............. 257/2 |
| 2009/0141547 A1* | 6/2009 | Jin et al. ........................ 365/163 |
| 2009/0261314 A1* | 10/2009 | Kim et al. .......................... 257/4 |
| 2011/0204315 A1* | 8/2011 | Baek et al. ........................ 257/4 |

* cited by examiner

*Primary Examiner* — Matthew Landau
*Assistant Examiner* — Joseph C Nicely
(74) *Attorney, Agent, or Firm* — F. Chau & Associates, LLC

(57) ABSTRACT

Provided are a non-volatile memory device which can be extended in a stack structure and thus can be highly integrated, and a method of manufacturing the non-volatile memory device. The non-volatile memory device includes: at least one first electrode, at least one second electrode crossing the at least one first electrode, at least one data storing layer interposed between the at least one first electrode and the second electrode, at a region in which the at least one first electrode crosses the at least one second electrode and at least one metal silicide layer interposed between the at least one first electrode and the at least one second electrode, at the region in which the at least one first electrode crosses the at least one second electrode.

7 Claims, 12 Drawing Sheets

NON-VOLATILE MEMORY DEVICE

CROSS-REFERENCE TO RELATED APPLICATIONS

This application claims the benefit of Korean Patent Application No. 10-2008-0061110, filed on Jun. 26, 2008, the disclosure of which is hereby incorporated by reference herein in its entirety.

BACKGROUND

1. Technical Field

The present invention relates to a semiconductor device, and more particularly, to a non-volatile memory device which can be extended in a multi-layer structure, and to a method of manufacturing the non-volatile memory device.

2. Description of the Related Art

Semiconductor devices may be required to be small in size and also to process large amounts of data. Thus, as a result, the operational speed and integration degree of non-volatile memory devices may need to be increased. In this respect, a multi-layered non-volatile memory device may be more beneficial for high integration than a conventional single-layered non-volatile memory device.

When using a multi-layered non-volatile memory device, memory cells can be stacked vertically on the same footprint as that of a single-layered non-volatile memory device. However, it may be difficult to connect and select memory cells of each layer in a multi-layered non-volatile memory device. Also, a multi-layered non-volatile memory device may require more manufacturing processes as the stacking number of the layers is increased, thereby possibly also increasing the manufacturing costs associated therewith.

SUMMARY OF THE INVENTION

In accordance with an example embodiment, a non-volatile memory device is provided. The non-volatile memory device includes at least one first electrode, at least one second electrode crossing the at least one first electrode, at least one data storing layer interposed between the at least one first electrode and the at least one second electrode, at a region in which the at least one first electrode crosses the at least one second electrode and at least one metal silicide layer interposed between the at least one first electrode and the at least one second electrode, at a region in which the at least one first electrode crosses the at least one second electrode.

The at least one metal silicide layer may be interposed between the at least one first electrode and the at least one data storing layer, and the at least one first electrode may comprise a first semiconductor, and the first semiconductor may contact the at least one metal silicide layer so as to form a schottky diode.

The non-volatile memory device may further comprise at least one junction layer interposed between the at least one first electrode and the at least one metal silicide layer, and the at least one first electrode may comprise a first semiconductor having a first conductivity, and the at least one junction layer may comprise a second semiconductor having a second conductivity which is opposite to the first conductivity. The at least one junction layer may be recessed in a sidewall of the at least one first electrode. The at least one metal silicide layer may be interposed between the at least one junction layer and the at least one second electrode. The at least one data storing layer may be interposed between the at least one junction layer and the at least one metal silicide layer. The at least one data storing layer may be interposed between the at least one first electrode and the at least one junction layer.

The at least one first electrode may comprise a plurality of first electrodes, and the at least one second electrode may comprise a plurality of second electrodes arranged between the plurality of the first electrodes. The plurality of the first electrodes may be stacked as a plurality of stacked layers, and the at least one metal silicide layer may comprise a plurality of metal silicide layers interposed between the plurality of the first electrodes and the plurality of the second electrodes.

In accordance with an example embodiment, a non-volatile memory is provided. The non-volatile memory includes at least one first electrode, at least one second electrode crossing the at least one first electrode and at least one data storing layer disposed at a cross point of the at least one first electrode and the at least one second electrode. The at least one first electrode comprises a first semiconductor having a first conductivity, and the at least one second electrode comprises a third semiconductor having a second conductivity, which is opposite to the first conductivity, and a buried layer buried in the third semiconductor, wherein the buried layer comprises a metal or metal silicide.

In accordance with an example embodiment of the present invention, a method of manufacturing a non-volatile memory device is provided. The method includes forming at least one first electrode, forming at least one metal silicide layer on a sidewall of the at least one first electrode, forming at least one data storing layer on a sidewall of the at least one first electrode and forming at least one second electrode crossing the at least one first electrode, by interposing the at least one metal silicide layer and the at least one data storing layer between the at least one first electrode and the second electrode, at a region in which the at least one first electrode crosses the at least one second electrode.

BRIEF DESCRIPTION OF THE DRAWINGS

Example embodiments of the present invention can be understood in more detail from the following description, taken in conjunction with the accompanying drawings of which.

DETAILED DESCRIPTION OF THE EXAMPLE EMBODIMENTS OF THE INVENTION

Figure 1:
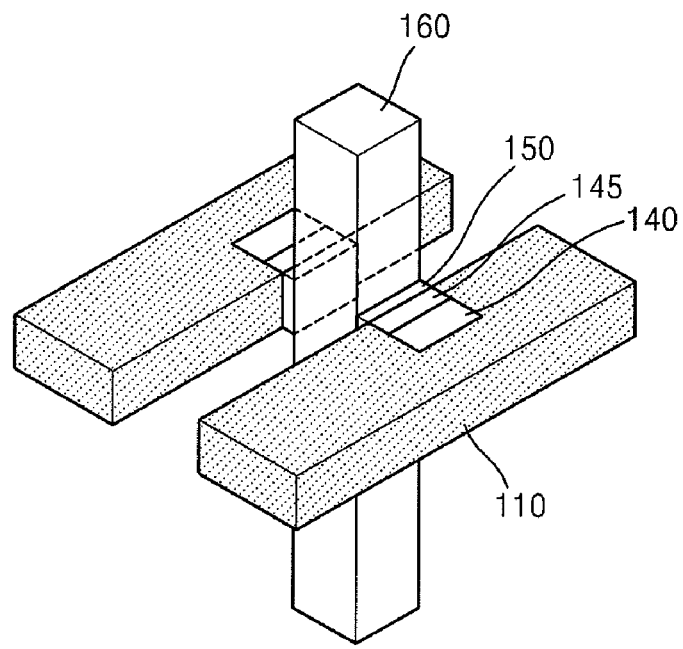
FIG. 1 is a perspective view illustrating a non-volatile memory device according to an example embodiment.

The inventive concept will now be described more fully with reference to the accompanying drawings, in which exemplary embodiments of the invention are shown. The invention may, however, be embodied in many different forms and should not be construed as being limited to the embodiments set forth herein. In the drawings, the thicknesses of layers and regions are exaggerated for clarity.

FIG. 1 is a perspective view illustrating a non-volatile memory device according to an example embodiment.

Referring to FIG. 1, at least one first electrode 110 and at least one second electrode 160 may be arranged to cross each other. For example, one second electrode 160 may be arranged to cross between a pair of first electrodes 110 at right angles. However, this embodiment is not limited thereto, and for example, the first electrodes 110 and the second electrode 160 may be arranged to cross one another at a predetermined angle.

At least one data storing layer 150 may be interposed between the first electrodes 110 and the second electrode 160. For example, data storing layers 150 may be interposed at cross points of the first electrodes 110 and the second electrode 160. However, this embodiment is not limited thereto. In another example, the data storing layers 150 may be connected to each other to form a broad layer between the first electrodes 110 and the second electrodes 160.

The data storing layers 150 may locally store resistance variation, and control the flow of current between the first electrodes 110 and the second electrode 160. For example, the data storing layers 150 may have high resistance, low resistance, or insulating properties, according to an applied voltage. The variable resistance characteristics of the data storing layers 150 may be used in data storage of the non-volatile memory device.

For example, the data storing layers 150 may function as a phase change resistor, and in this case, the non-volatile memory device may operate as a phase-change random access memory (PRAM). For example, a phase change resistor may include a calcogenide compound such as GST (GeSbxTey). The phase change resistor may be in a high resistance state or a low resistance state according to the crystallization states thereof.

Alternatively, the data storing layers 150 may function as, for example, a variable resistor, and in this case, the non-volatile memory device may operate as a resistance random access memory (RRAM). A variable resistor is different from a phase change resistor in that resistance can be varied without a change of the crystalline state of the variable resistor. However, variable resistors may be understood in the context of a broad concept including phase change resistors. Examples of materials functioning as a variable resistor may include but are not limited to nickel oxide (NiO), niobium pentoxide ($Nb_2O_5$), and zinc oxide (ZnO).

Alternatively, the data storing layers 150 may function, for example, as an insulation destroying material. For example, the data storing layers 150 may include an insulating material such as an oxide whose insulation can be destroyed according to an applied voltage. The non-volatile memory device as described above may be used as a one-time program (OTP) memory. An OTP memory may be used in products requiring very large memory capacity despite only being programmed once.

As the insulation destroying material may not recover its insulation characteristics, it may be referred to as a fuse. On the other hand, the above-described phase change resistor and/or variable resistor may be referred to as anti-fuses because of the change of their conductivity.

At least one junction layer 140 and at least one metal silicide layer 145 may be further interposed between the first electrodes 110 and the second electrode 160 at a region in which the first electrodes 110 cross the second electrode 160. For example, junction layers 140 may be arranged to contact the first electrodes 110 and the data storing layers 150 may be arranged to contact sidewalls of the second electrode 160, and the metal silicide layers 145 may be interposed between the data storing layers 150 and the junction layers 140.

The first electrodes 110 may include a first semiconductor having a first conductivity, and the junction layers 140 may include a second semiconductor having a second conductivity, which is opposite to the first conductivity. For example, the first semiconductor may be doped with first conductive impurities, and the second semiconductor may be doped with second conductive impurities. For example, the first conductivity may be N type, and the second conductivity may be P type. Alternatively, the first conductivity may be P type, and the second conductivity may be N type.

Accordingly, as the first electrodes 110 and the junction layers 140 contact each other, they may form a diode junction or a PN junction. Such diode junction may rectify current flow between the first electrodes 110 and the second electrode 160. That is, the current flow between the first electrodes 110 and the second electrode 160 may have directivity according to the polarity of the diode junction or PN junction.

The junction layers 140 may be locally provided to be recessed from sidewalls of the first electrodes 110. Accordingly, there may be no need to allocate space for forming the junction layers 140, and thus the non-volatile memory device can be readily highly integrated. In addition, by recessing the junction layers 140 in local portions of the first electrodes 110, the diode junction or PN junction can be reduced, thereby reducing line resistance of the first electrodes 110.

The metal silicide layers 145 may function as, for example, diffusion barriers. Accordingly, diffusion of impurities in the junction layers 140 may be blocked by the metal silicide layers 145. Also, the metal silicide layers 145 may help reduce contact resistance between the metal silicide layers 145 and the junction layers 140. For example, the metal silicide layers 145 may include one of titanium silicide, cobalt silicide, nickel silicide, tungsten silicide, zirconium silicide, molybdenum silicide, hafnium silicide, and platinum silicide, or a stacking structure formed of at least two of these.

The second electrode 160 may include a conductor and/or semiconductor. For example, the second electrode 160 may include one of polysilicon, metal, and metal silicide, or a stacking structure formed of at least two of these.

The non-volatile memory device according to the current example embodiment may constitute memory cells. For example, each of the first electrodes 110 may be a bit line, and the second electrode 160 may be a word line, or vice versa.

Figure 2:
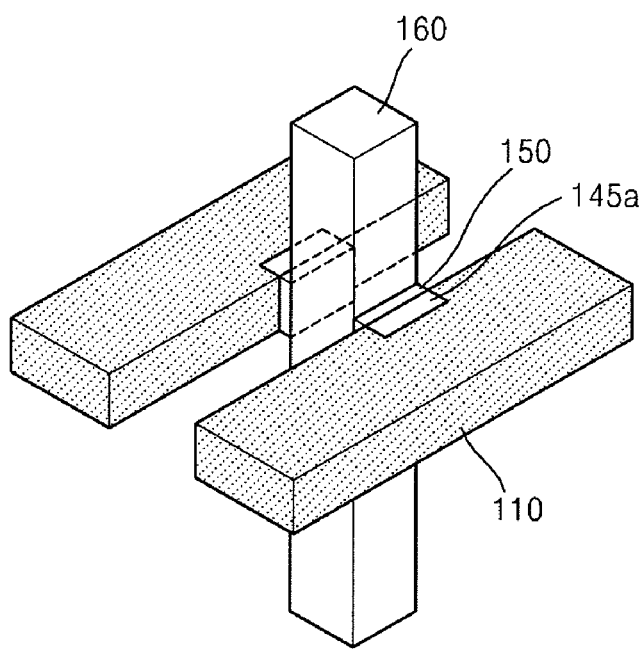
FIG. 2 is a perspective view illustrating a non-volatile memory device according to an example embodiment.

FIG. 2 is a perspective view illustrating a non-volatile memory device according to another example embodiment. The non-volatile memory device of FIG. 2 may correspond to that of FIG. 1 with some modified or omitted components. Accordingly, common description in these two embodiments will not be repeated.

Referring to FIG. 2, the junction layers 140 of FIG. 1 are omitted, and the metal silicide layers 145a may be interposed between the data storing layers 150 and the first electrodes 110. The first electrodes 110 may be semiconductors. The metal silicide layers 145a contact the first electrodes 110 to form a schottky diode or a schottky barrier. Accordingly, in the current example embodiment, a schottky diode may rectify electric current instead of the PN junction diode of FIG. 1.

A schottky diode may refer to a junction barrier between metal and a semiconductor. However, a metal silicide-semiconductor junction is also known to form a schottky diode, while forming a stable interface compared to a metal-semiconductor junction.

Accordingly, the non-volatile memory device according to the current embodiment can be simplified by using a schottky diode instead of a PN junction diode. Thus, the non-volatile memory device can be readily highly integrated.

Figure 3:
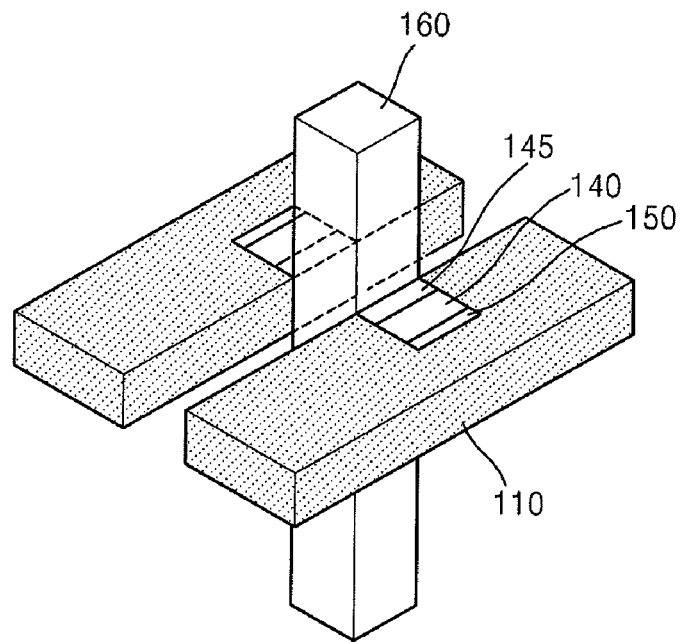
FIG. 3 is a perspective view illustrating a non-volatile memory device according to an example embodiment.

FIG. 3 is a perspective view illustrating a non-volatile memory device according to another example embodiment. The non-volatile memory device of FIG. 3 may correspond to that of FIG. 1 with some modified or omitted components. Accordingly, common description in these two embodiments will not be repeated.

Referring to FIG. 3, the data storing layers 150 may be interposed between the junction layers 140 and the first electrodes 110. The metal silicide layers 145 may be interposed between the junction layers 140 and the second electrode 160.

In the current example embodiment, the first electrodes 110 and the junction layers 140 do not directly form a PN junction. However, as the data storing layers 150 are changed into a low resistance state during the operation of the non-volatile memory device, the first electrodes 110 and the junction layers 140 may form a PN junction. Accordingly, the non-volatile memory device according to the current example embodiment may operate in the same manner as the non-volatile memory device of FIG. 1.

Figure 4:
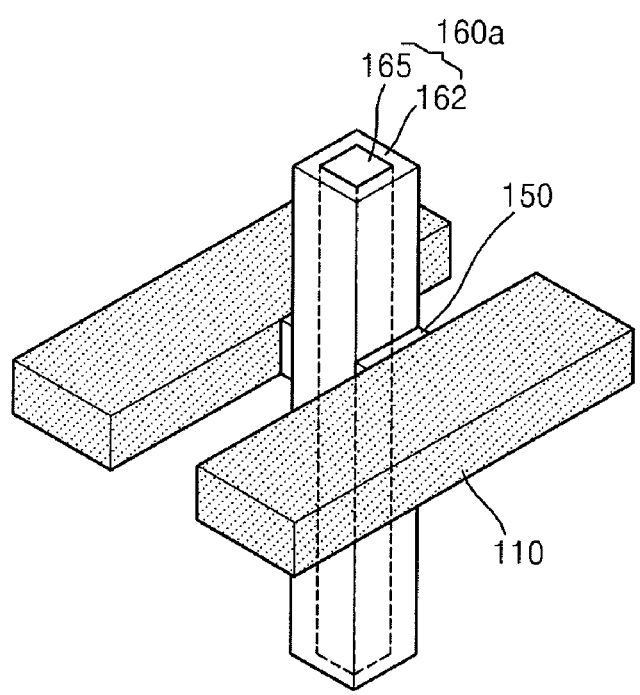
FIG. 4 is a perspective view illustrating a non-volatile memory device according to an example embodiment.

FIG. 4 is a perspective view illustrating a non-volatile memory device according to another example embodiment. The non-volatile memory device of FIG. 4 may correspond to that of FIG. 1 with some modified or omitted components. Accordingly, common description in these two embodiments will not be repeated.

Referring to FIG. 4, the data storing layers 150 may be directly interposed at cross points of the first electrodes 110 and the second electrodes 160a without interposing the junction layers 140 and the metal silicide layers 145 illustrated FIG. 1. For example, the first electrodes 110 may include a first semiconductor having a first conductivity, and a second electrode 160a may include a third semiconductor 162 having a second conductivity and a buried layer 165. The buried layer 165 may be buried inside the third semiconductor 162.

When the data storing layers 150 are changed into a low resistance state, the first electrodes 110 and the second electrode 160a form a PN junction and can function as a diode. The buried layer 165 may be formed of a conductor having a lower resistance than the third semiconductor 162, such as, for example, metal or metal silicide, to reduce resistance of the second electrode 160a.

Figure 5:
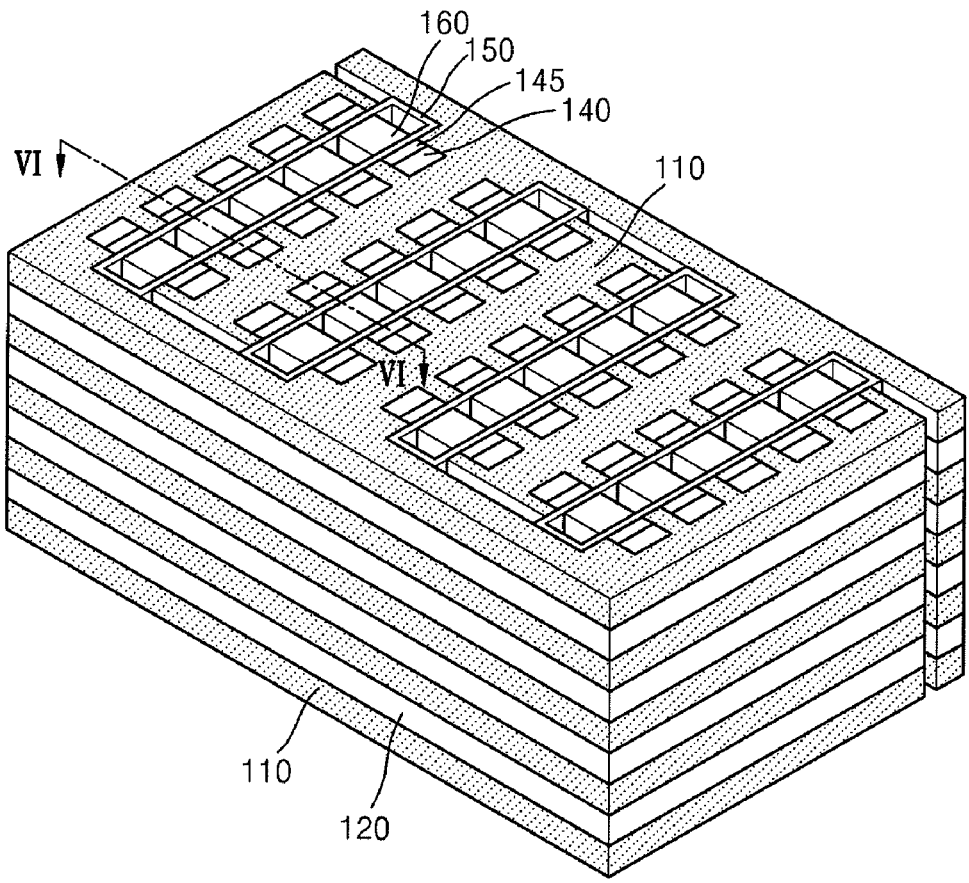
FIG. 5 is a perspective view illustrating a non-volatile memory device according to an example embodiment.
Figure 6:
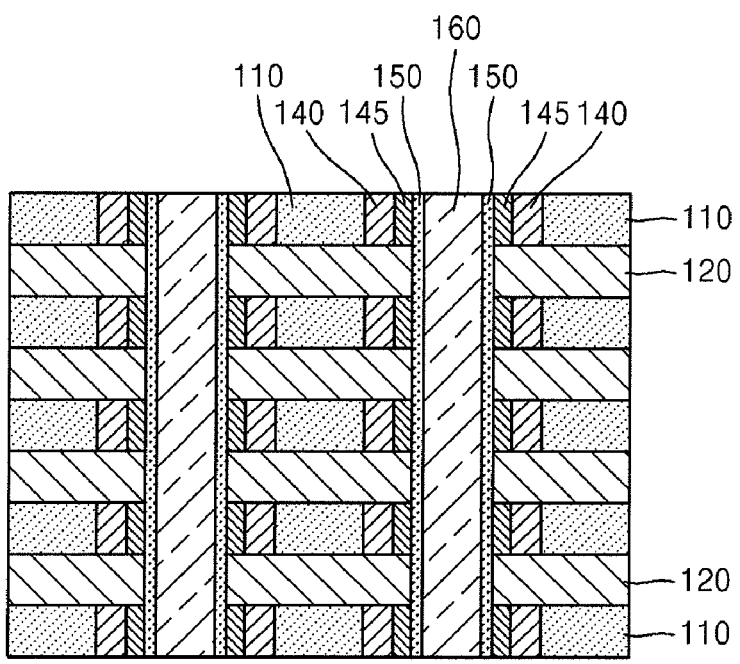
FIG. 6 is a cross-sectional view of the non-volatile memory device of FIG. 5 cut along a line VI-VI', according to an example embodiment.

FIG. 5 is a perspective view illustrating a non-volatile memory device according to another example embodiment, and FIG. 6 is a cross-sectional view of the non-volatile memory device of FIG. 5 cut along a line VI-VI'. The non-volatile memory device of FIG. 5 is based on that of FIG. 1, and thus common description of the two example embodiments may not be repeated.

Referring to FIGS. 5 and 6, a plurality of first electrodes 110 may be arranged two-dimensionally and stacked three-dimensionally. A plurality of second electrodes 160 may extend across the stacked first electrodes 110. The second electrodes 160 may be arranged between the first electrodes 110, and spaced apart from each other in the extension direction of the first electrodes 110. For example, the first electrodes 110 and the second electrodes 160 may be arranged to cross each other at right angles.

The junction layers 140 and the metal silicide layers 145 may be disposed at cross points of the first electrodes 110 and the second electrodes 160, and interposed between the first electrodes 110 and the data storing layers 150. The data storing layers 150 may be interposed between the first electrodes 110 and the second electrodes 160. For example, the data storing layers 150 may be cylindrically-shaped and surrounding a group of second electrodes 160 interposed between one pair of the first electrodes 110. However, the form of the data storing layers 150 is not limited thereto. For example, as illustrated in FIG. 1, the data storing layers 150 may be limited to regions in which the first electrodes 110 cross the second electrodes 160.

In such a three-dimensional structure, the second electrodes 160 between the first electrodes 110 may be shared by memory cells on both sides of the second electrodes 160. Meanwhile, the first electrodes 110 in each layer may be accessed for operation by being divided into two groups, odd-numbered and even-numbered groups. That is, the first electrodes 110 in each layer may be accessed for operation by one pair of bit lines.

In the non-volatile memory device according to the current example embodiment, the plurality of memory cells may be arranged three-dimensionally. The number of the memory cells may be readily adjusted by, for example, adjusting the number and length of the first electrodes 110 and the second electrodes 160. Accordingly, the non-volatile memory device can be readily highly integrated, and thus may be used in high capacity products.

Figure 7:
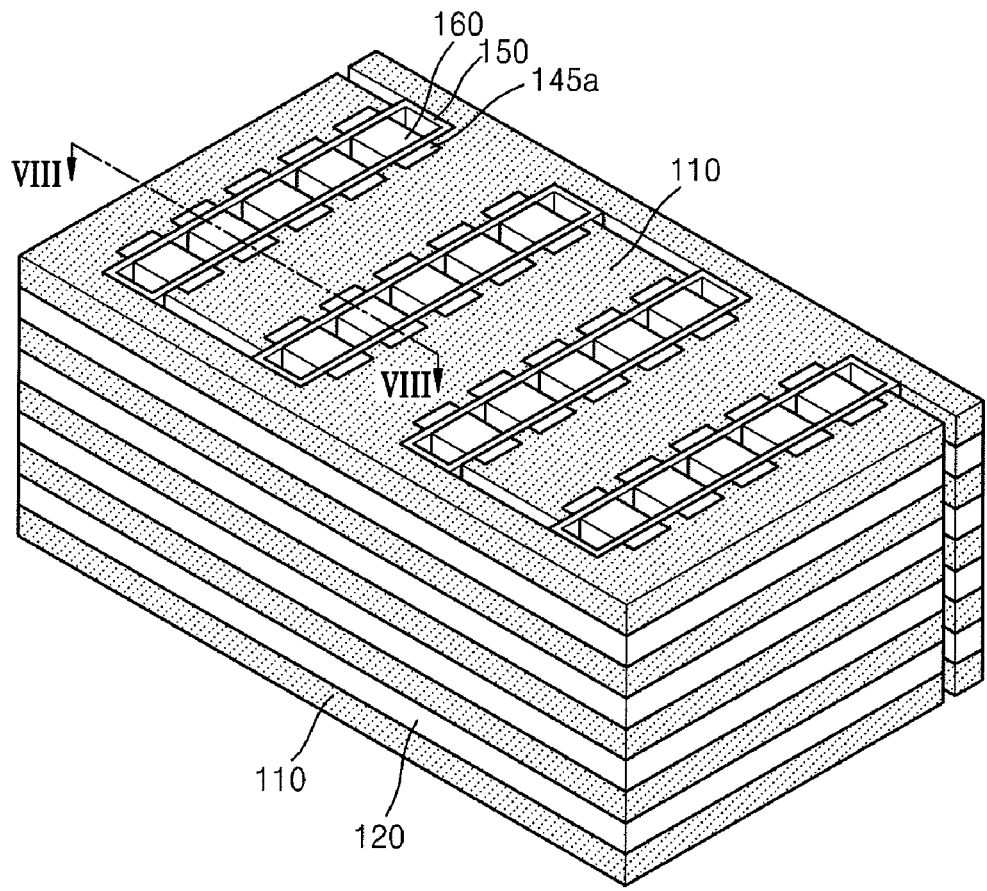
FIG. 7 is a perspective view illustrating a non-volatile memory device according to an example embodiment.
Figure 8:
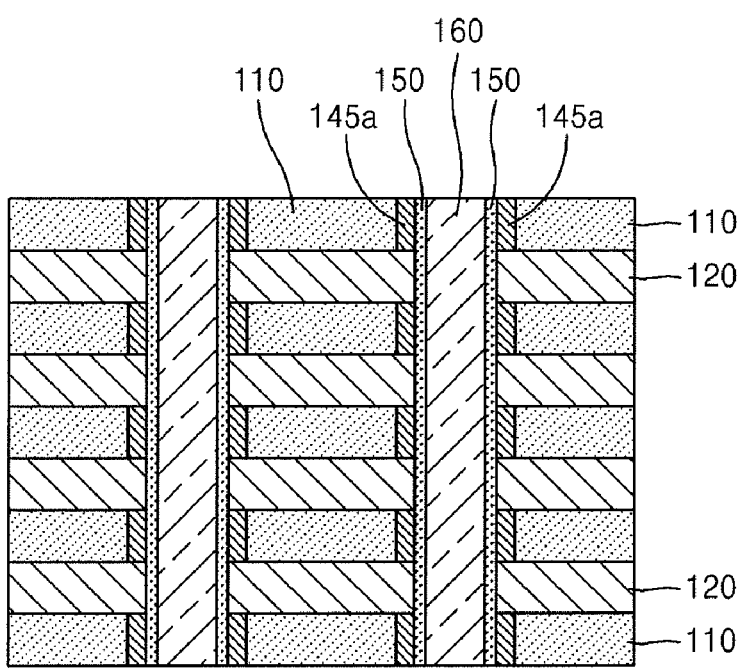
FIG. 8 is a cross-sectional view of the non-volatile memory device of FIG. 7 cut along a line VII-VII', according to an example embodiment.

FIG. 7 is a perspective view illustrating a non-volatile memory device according to another example embodiment, and FIG. 8 is a cross-sectional view of the non-volatile memory device of FIG. 7 cut along a line VII-VII'. The non-volatile memory device of FIG. 7 is based on that of FIG. 2, and thus common description in the two example embodiments may not be repeated.

Referring to FIGS. 7 and 8, a plurality of the first electrodes 110 may be arranged two-dimensionally and stacked three-dimensionally. A plurality of second electrodes 160 may extend across the stacked first electrodes 110. The second electrodes 160 may be arranged between the first electrodes 110, and spacer apart from each other in the extension direction of the first electrodes 110. For example, the first electrodes 110 and the second electrodes 160 may be arranged to cross each other at right angles.

The metal silicide layers 145a may be interposed between the first electrodes 110 and the second electrodes 160, in a region in which the first electrodes 110 cross the second electrode 160, and interposed between the data storing layers 150 and the first electrodes 110. For example, the data storing layers 150 may be cylindrically-shaped as described with reference to FIGS. 5 and 6, but the form of the data storing layers 150 is not limited thereto.

In this three-dimensional structure, the second electrodes 160 between the first electrodes 110 may be shared by memory cells on both sides of the second electrodes 160. Meanwhile, the first electrodes 110 in each layer may be accessed for operation in two, odd-numbered and even-numbered groups. For example, the first electrodes 110 in each layer may be accessed for operation by one pair of bit lines.

Figure 9:
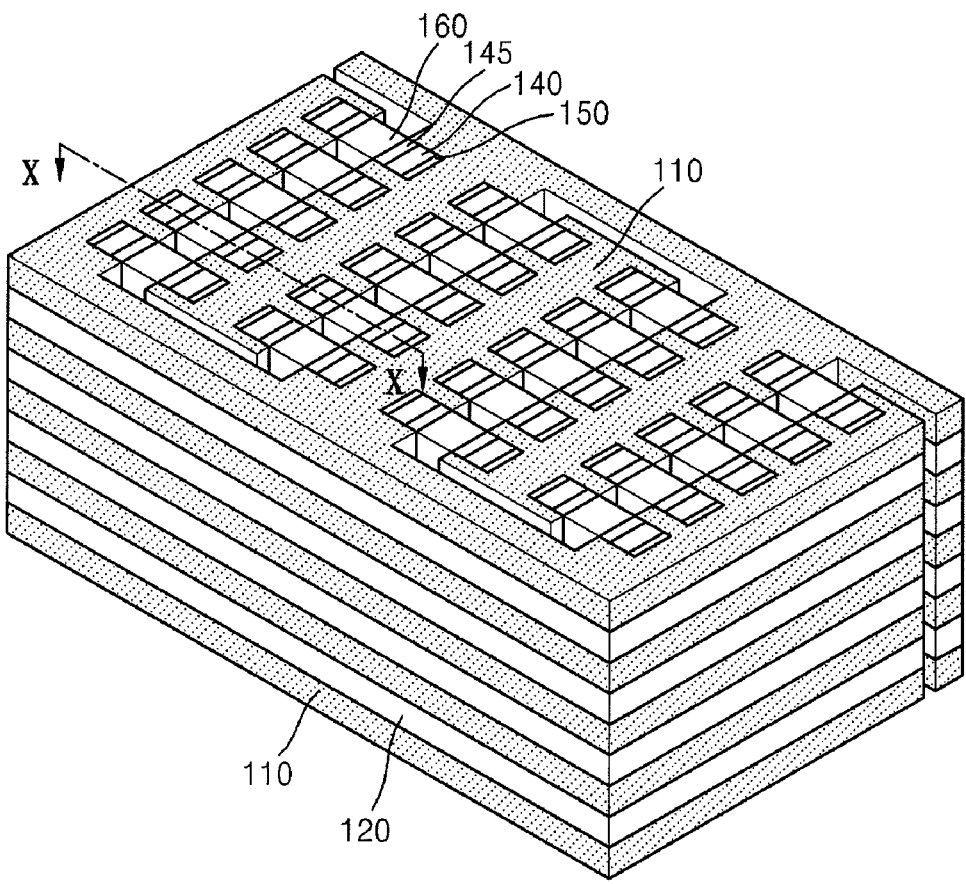
FIG. 9 is a perspective view illustrating a non-volatile memory device according to an example embodiment.
Figure 10:
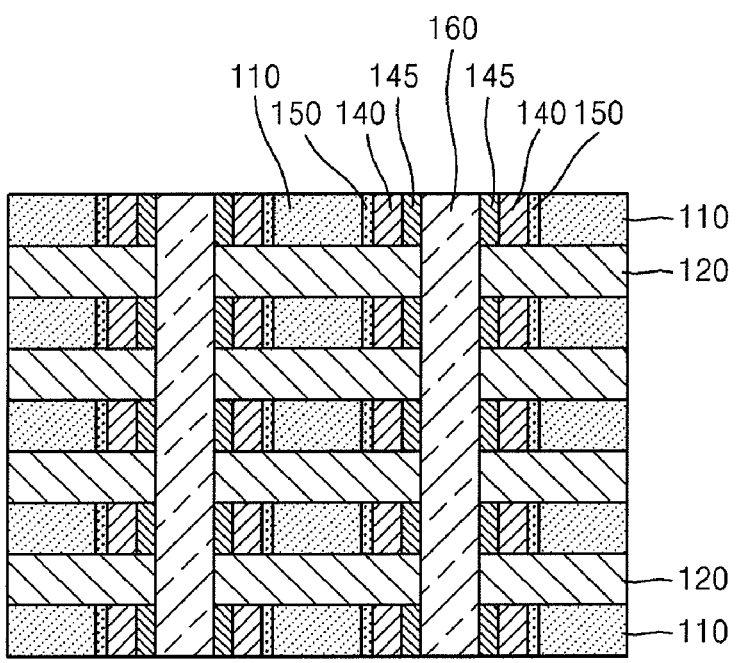
FIG. 10 is a cross-sectional view of the non-volatile memory device of FIG. 9 cut along a line X-X', according to an example embodiment.

FIG. 9 is a perspective view illustrating a non-volatile memory device according to another example embodiment, and FIG. 10 is a cross-sectional view of the non-volatile memory device of FIG. 9 cut along a line X-X'. The non-volatile memory device of FIG. 9 is based on that of FIG. 3, and thus common description in the two example embodiments may not be repeated.

Referring to FIGS. 9 and 10, a plurality of first electrodes 110 may be arranged two-dimensionally and stacked three-dimensionally. A plurality of second electrodes 160 may extend across the stacked first electrodes 110. The second electrodes 160 may be arranged between the first electrodes 110, and spaced apart from each other in the extension direction of the first electrodes 110. For example, the first electrodes 110 and the second electrodes 160 may be arranged to cross each other at right angles.

The junction layers 140 and the metal silicide layers 145 may be interposed between the first electrodes 110 and the second electrodes 160, at a region in which the first electrodes 110 cross the second electrodes 160. The data storing layers 150 may be interposed between the first electrodes 110 and the junction layers 140.

In this three-dimensional structure, the second electrodes 160 between the first electrodes 110 may be shared by memory cells on both sides of the second electrodes 160. Meanwhile, the first electrodes 110 in each layer may be accessed for operation in two, odd-numbered and even-numbered groups. For example, the first electrodes 110 in each layer may be accessed for operation by one pair of bit lines.

Figure 11:
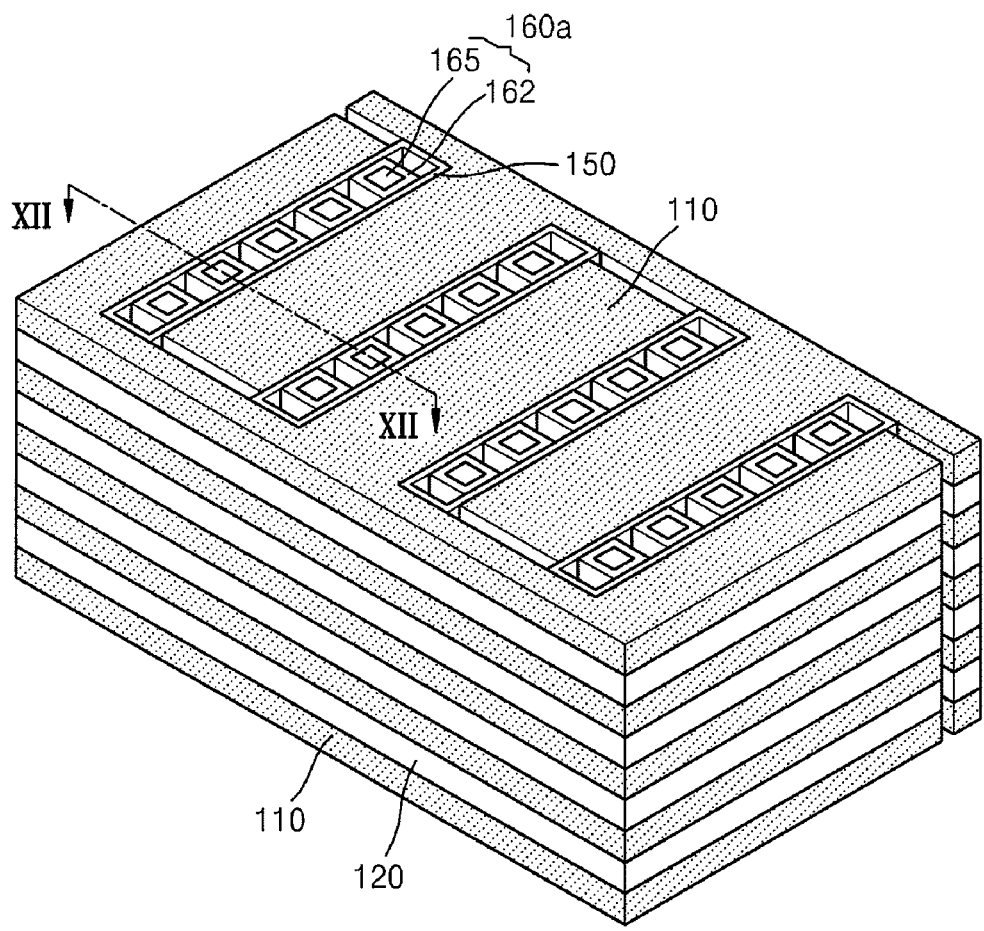
FIG. 11 is a perspective view illustrating a non-volatile memory device according to an example embodiment.
Figure 12:
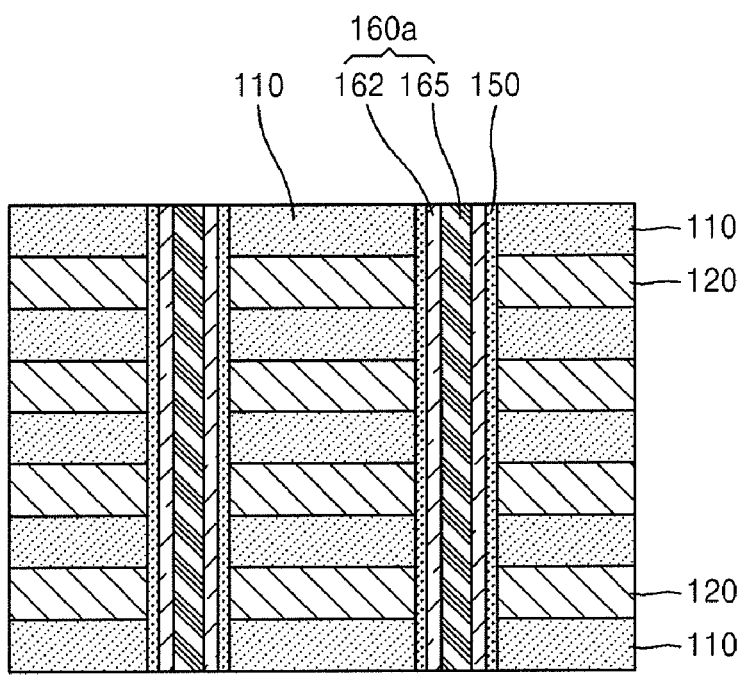
FIG. 12 is a cross-sectional view of the non-volatile memory device of FIG. 11 cut along a line XII-XII', according to an example embodiment.

FIG. 11 is a perspective view illustrating a non-volatile memory device according to another example embodiment, and FIG. 12 is a cross-sectional view of the non-volatile memory device of FIG. 11 cut along a line XII-XII'. The non-volatile memory device of FIG. 11 is based on that of FIG. 4, and thus common description in the two example embodiments may not be repeated.

Referring to FIGS. 11 and 12, a plurality of first electrodes 110 may be arranged two-dimensionally and stacked three-dimensionally. A plurality of second electrodes 160a may extend across the stacked first electrodes 110. The second electrodes 160a may be arranged between the first electrodes 110, and spaced apart from each other in the extension direction of the first electrodes 110. For example, the first electrodes 110 and the second electrodes 160a may be arranged to cross each other at right angles. For example, the data storing layers 150 may be cylindrically-shaped between the first electrodes 110 and the second electrodes 160a, as described with reference to FIGS. 5 and 6.

In this three-dimensional structure, the second electrodes 160a between the first electrodes 110 may be shared by memory cells on both sides of the second electrodes 160a. Meanwhile, the first electrodes 110 in each layer may be accessed for operation in two, odd-numbered and even-numbered groups. For example, the first electrodes 110 in each layer may be accessed for operation by one pair of bit lines.

FIGS. 13 through 18 are cross-sectional views illustrating a method of manufacturing a non-volatile memory device, according to an example embodiment.

Figure 13:
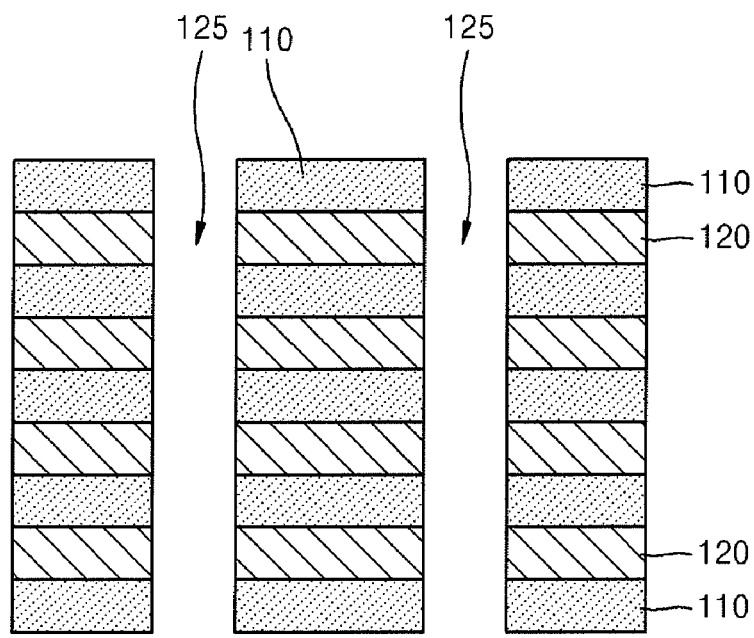
FIGS. 13 through 18 are cross-sectional views illustrating a method of manufacturing a non-volatile memory device, according to an example embodiment.

Referring to FIG. 13, a stack structure of first electrodes 110 may be formed. The first electrodes 110 may be arranged to be separated from one another by insulating layers 120. Each insulating layers 120 may include a complex layer formed of one material or various insulating materials.

For example, the insulating layers 120 and the first electrodes 110 may be stacked alternately, and trenches 125 may be formed between the stack structures of the first electrodes 110. During the formation process, for example, the first electrodes 110 may be doped with first conductive impurities using an in-situ doping method while being formed or using an ion implantation method after the trenches 125 are formed. The trenches 125 may be formed by, for example, photolithography and etching. The number of the first electrodes 110 and the trenches 125 may be selected according to the capacity of the non-volatile memory device, and does not limit the scope of the present example embodiment.

Figure 14:
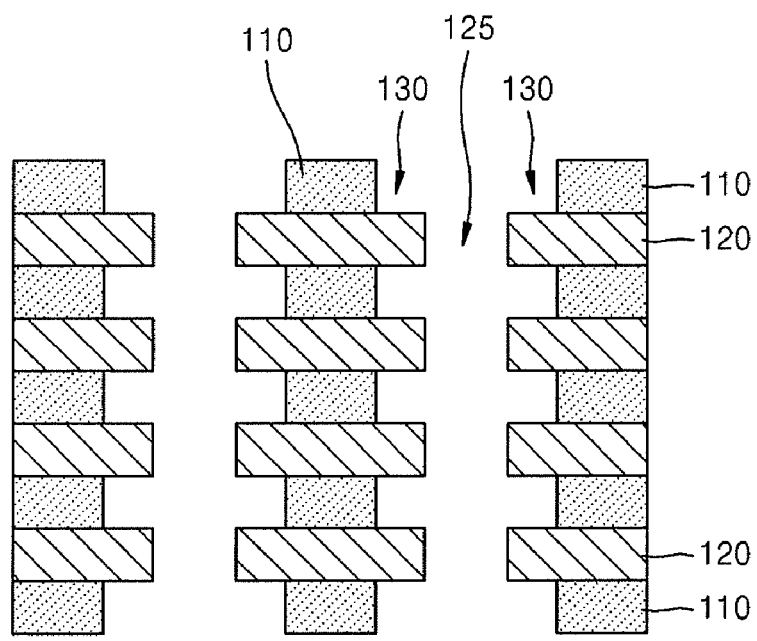

Referring to FIG. 14, the sidewalls of the first electrodes 110 are recessed to form grooves 130. The grooves 130 may extend the portion of the trenches 125 between the first electrodes 110. For example, the grooves 130 may be formed by etching the first electrodes 110 to a predetermined depth using an isotropic etching method such as a wet etching method or a chemical dry etching method. An etching chemical may enter sidewalls of the first electrodes 110 through the trenches 125.

Figure 15:
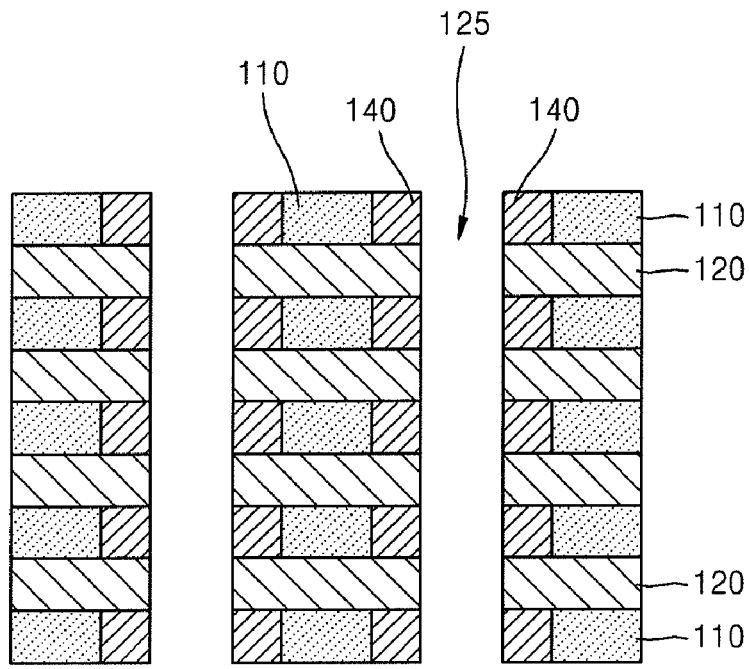

Referring to FIG. 15, junction layers 140 may be formed on the sidewalls of the first electrodes 110. For example, the junction layers 140 may be doped with second conductive impurities using an in-situ doping method while the junction layers 140 are formed, or using an ion implantation method after the junction layers 140 are formed. An example of the ion implantation method includes but is not limited to a high angle ion implantation method.

For example, the junction layers 140 may be formed by depositing a semiconductor material in the trenches 125 to fill the grooves 130 using a chemical vapor deposition (CVD) method, and then anisotropically etching the semiconductor material to remain in the grooves 130. The anisotropic etching may be, for example, plasma dry etching.

Alternatively, the junction layers 140 may be formed using, for example, a selective epitaxial growth method. According to the selective epitaxial growth method, the junction layers 140 may not be grown on the insulating layers 120 but only on the sidewalls of the first electrodes 140, selectively.

Figure 16:
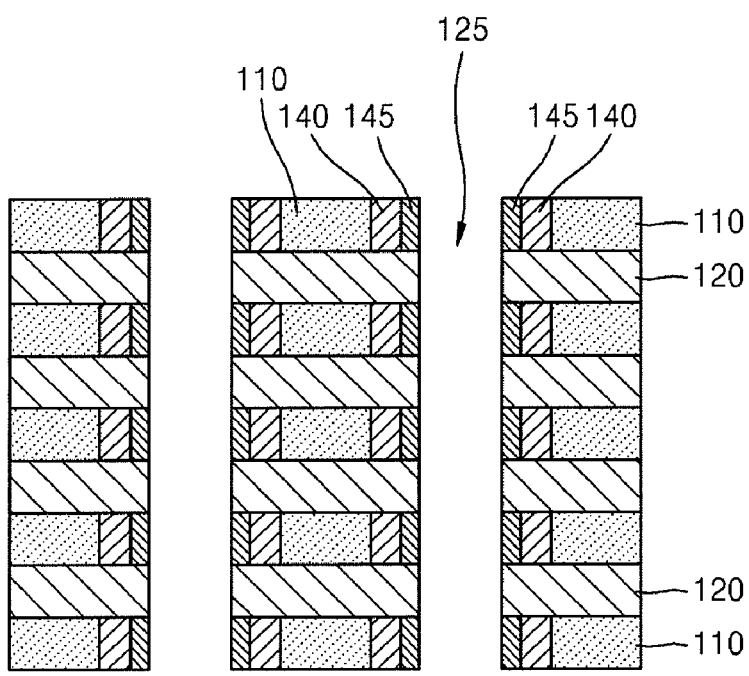

Referring to FIG. 16, metal silicide layers 145 may be formed on the junction layers 140 in the trenches 125. The metal silicide layers 145 may be formed not on the insulating layers 120 but selectively only on the junction layers 140. When using a self-aligned silicidation method, the metal silicide layers 145 may be selectively formed only on the junction layers 140.

For example, a metal layer may be formed on an inner surface of the trenches 125 and a first heat treatment process may be performed. Accordingly, as the metal layer and the junction layers 140 react with each other, a first metal silicide may be formed. In this case, as the insulating layers 120 and the metal layer do not react with each other, a first metal silicide is not formed on the insulating layers 120. Next, the remaining metal layer may be selectively removed using, for example, a wet etching method while leaving the first metal silicide. Next, selectively, the first metal silicide may be converted into a second metal silicide using, for example, a second heat treatment process. Accordingly, the metal silicide layers 145 may be formed of the first metal silicide and/or the second metal silicide.

Figure 17:
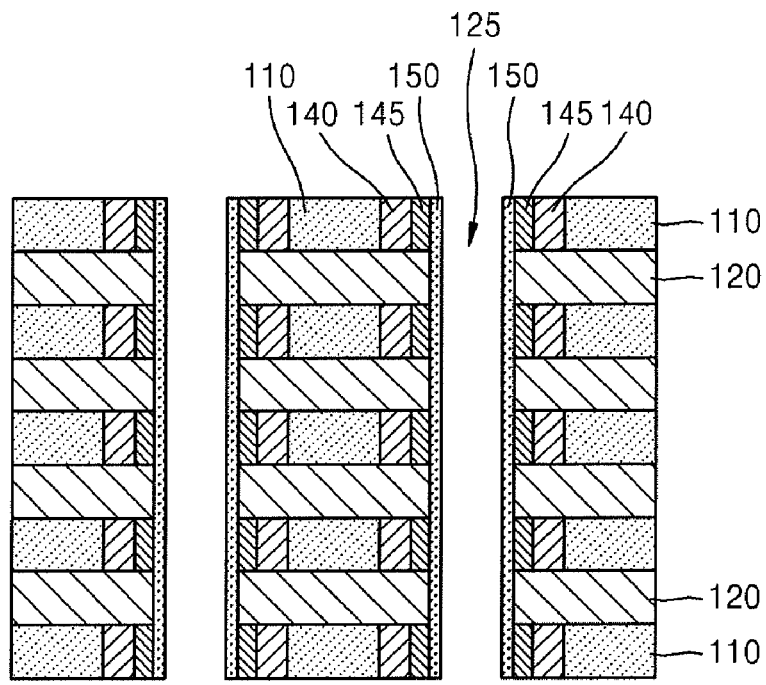

Referring to FIG. 17, data storing layers 150 may be formed on the metal silicide layers 145 and the insulating layers 120 in the trenches 125. For example, the data storing layers 150 may be formed using a chemical vapor deposition (CVD) method, by which the sidewalls of the trenches 125 can be sufficiently coated.

Figure 18:
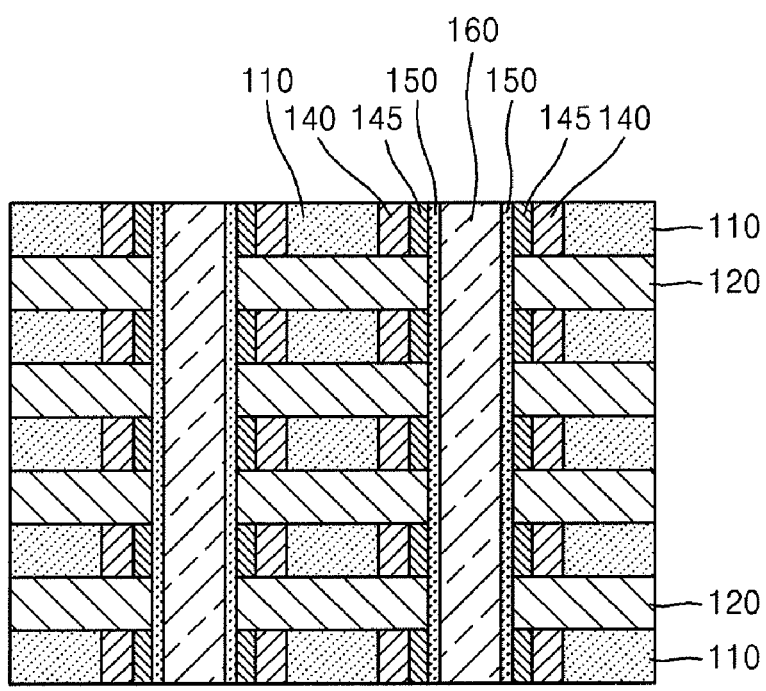

Referring to FIG. 18, second electrodes 160 may be formed on the data storing layers 150 inside the trenches 125. For example, the second electrodes 160 may be formed by forming conductive layers to fill the trenches 125 and then planarizing the conductive layers.

According to the above-described method of manufacturing a non-volatile memory device, memory cells having a stack structure can be formed economically in a single process.

Figure 19:
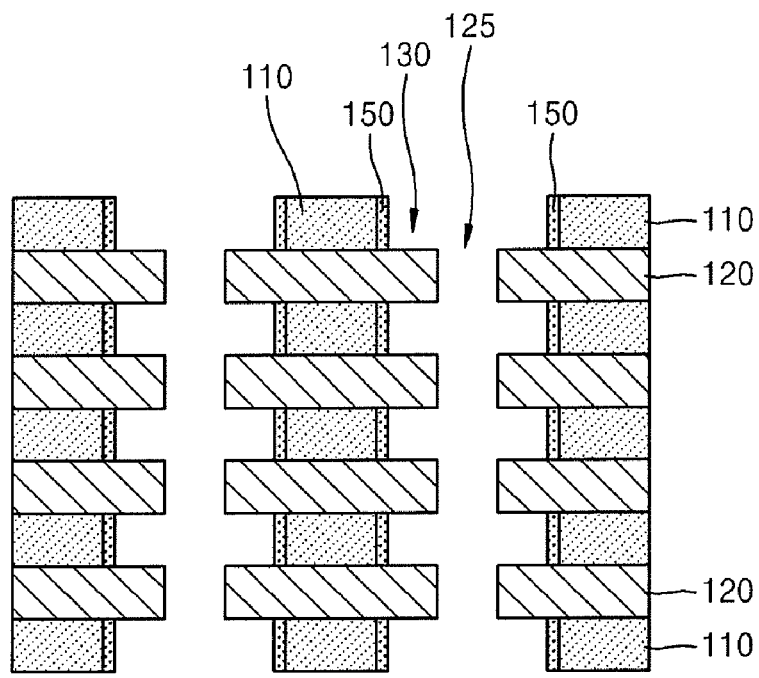
FIGS. 19 through 21 are cross-sectional views illustrating a method of manufacturing a non-volatile memory device, according to an example embodiment.
Figure 20:
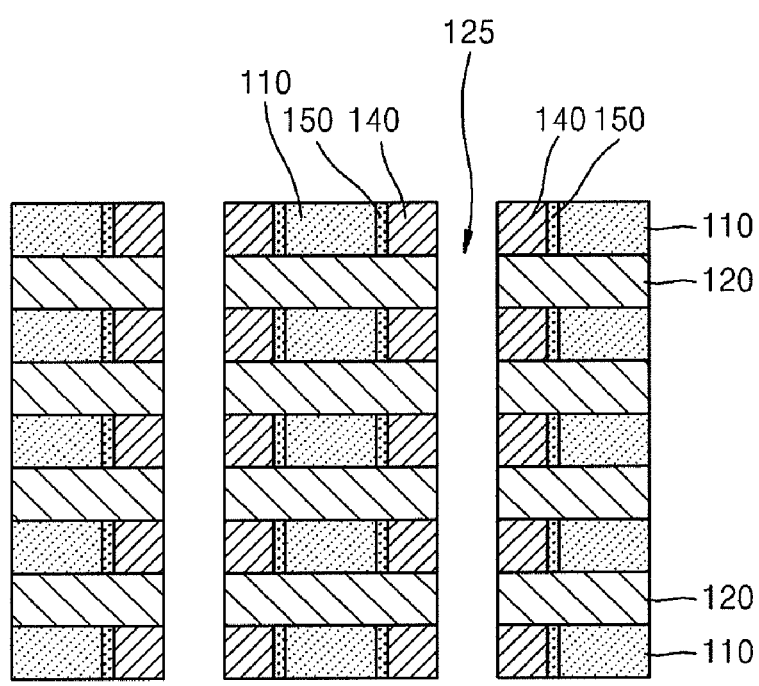
Figure 21:
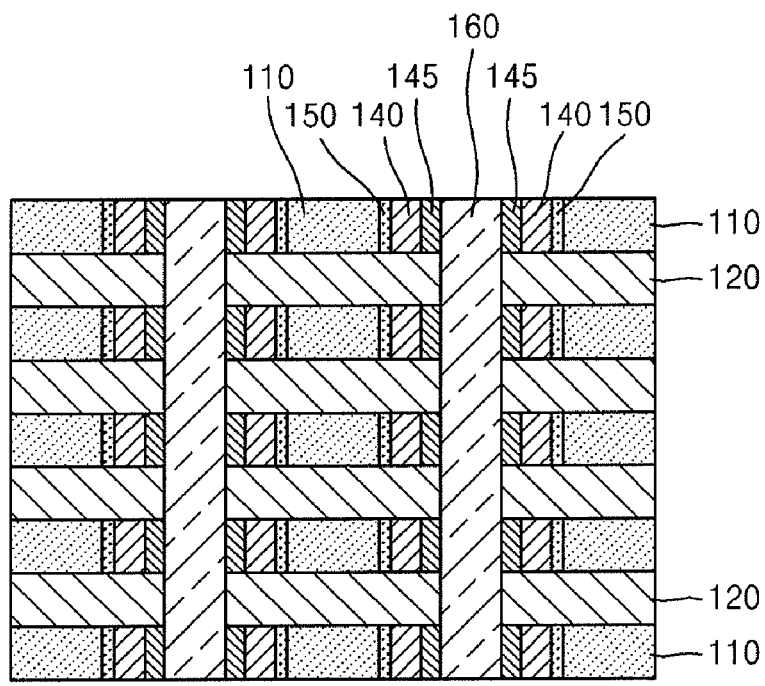

FIGS. 19 through 21 are cross-sectional views illustrating a method of manufacturing a non-volatile memory device, according to another example embodiment. The method illustrated in FIGS. 19 through 21 is a modified version of the method illustrated in FIGS. 13 through 18 and described above, and thus common description of the two example embodiments will not be repeated. For example, the operation illustrated in FIG. 19 may be performed after the operation illustrated in FIG. 14.

Referring to FIG. 19, data storing layers 150 may be formed on sidewalls of the first electrodes 110 in the grooves 130. For example, the data storing layers 150 may be formed by forming material layers and then anisotropically etching the material layers in the form of spacers. However, in another example embodiment, the data storing layers 150 may be extended along the surfaces of the first electrodes 110 and the insulating layers 120 inside the trenches 125 and the grooves 130, unlike FIG. 19.

Referring to FIG. 20, junction layers 140 may be formed on the data storing layers 150 inside the grooves 130.

Referring to FIG. 21, the metal silicide layers 145 may be formed on the junction layers 140, and the second electrodes 160 may be formed inside the trenches 125.

Figure 22:
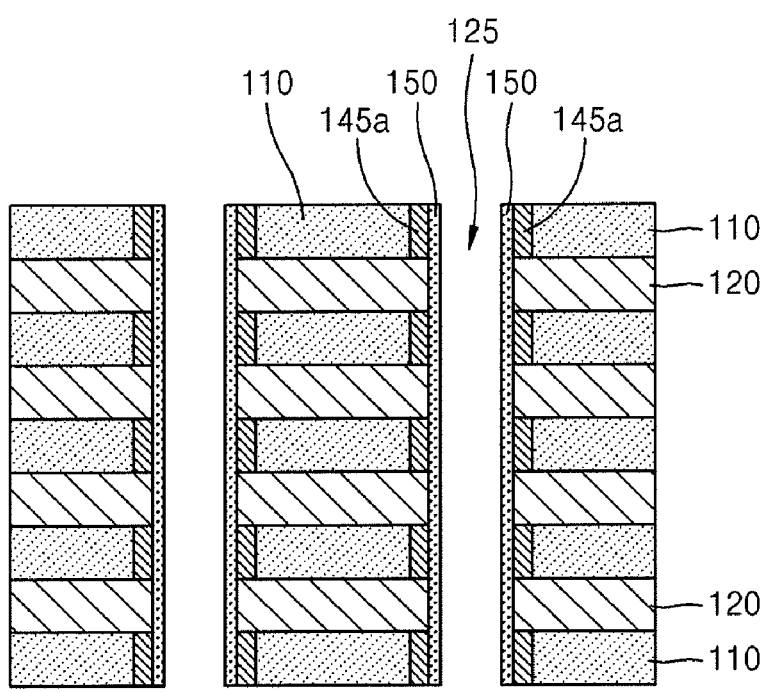
FIG. 22 is a cross-sectional view for explaining a method of manufacturing a non-volatile memory device, according to an example embodiment.

FIG. 22 is a cross-sectional view for explaining a method of manufacturing a non-volatile memory device, according to another example embodiment. The method explained with reference to FIG. 22 is a modified version of the method illustrated in FIGS. 13 through 18 and described above, and thus common description of the two example embodiments will not be repeated. For example, the operation illustrated in FIG. 22 may be performed after the operation illustrated in FIG. 13.

Referring to FIG. 22, metal silicide layers 145*a* may be formed on sidewalls of the first electrodes 110 exposed by the trenches 125. The metal silicide layers 145*a* may be formed using a method similar to the method of forming the metal silicide layers 145 described with reference to FIG. 16. However, the metal silicide layers 145*a* are different from the metal silicide layers 145 of FIG. 16 in that they are formed by reaction of the semiconductor material of the first electrodes 110 with a metal.

Next, the data storing layers 150 may be formed on the metal silicide layers 145*a* inside the trenches 125.

Next, as described with reference to FIG. 18, second electrodes 160 may be formed on the data storing layers 150 so as to fill the trenches 125 as illustrated in FIG. 8.

Figure 23:
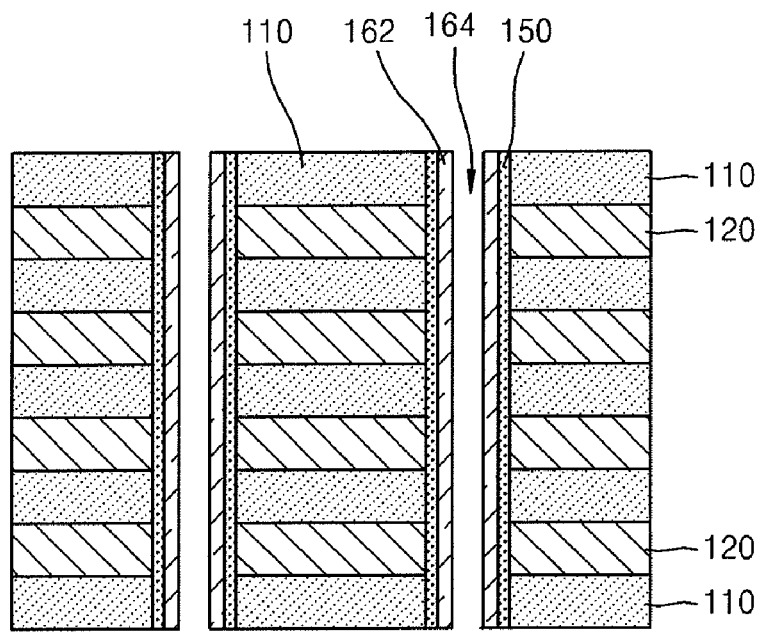
FIGS. 23 and 24 are cross-sectional views illustrating a method of manufacturing a non-volatile memory device, according to an example embodiment.
Figure 24:
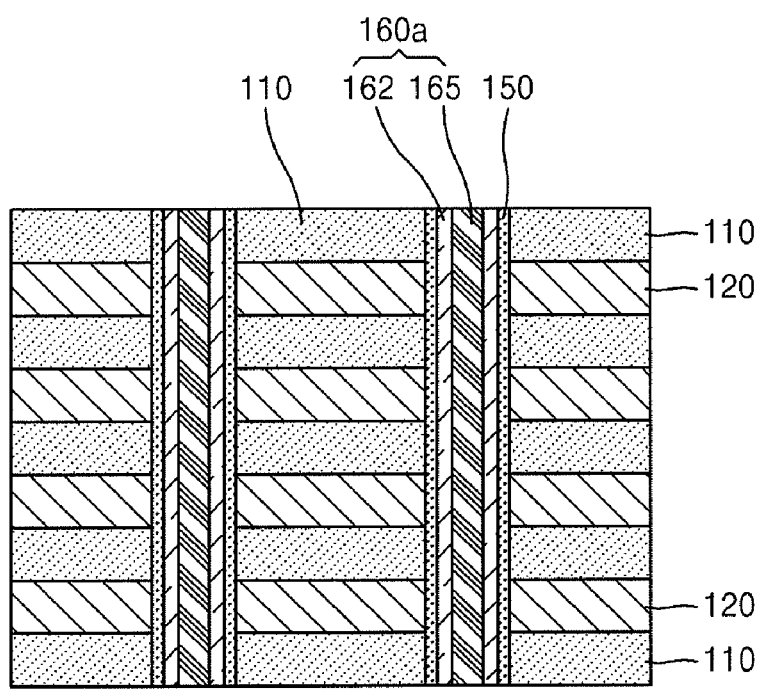

FIGS. 23 and 24 are cross-sectional views illustrating a method of manufacturing a non-volatile memory device, according to another example embodiment. The method illustrated in FIGS. 23 and 24 is a modified version of the method illustrated in FIGS. 13 through 18 and described above, and thus common description of the two example embodiments will not be repeated. For example, the operation of FIG. 23 may be performed after the operation of FIG. 13.

Referring to FIG. 23, the data storing layers 150 may be formed on a sidewall surface of the first electrodes 110 and the insulating layers 120 inside the trenches 125 of FIG. 13. Next, a third semiconductor 162 may be formed on the data storing layers 150 inside the trenches 125. For example, the third semiconductor 162 may be formed by depositing a semiconductor material so as not to fill the trenches 125 and then anisotropically etching the semiconductor material in the form of spacers. Holes 164 may be defined inside the third semiconductor 162.

Next, buried layers 165 may be formed inside the holes 164. The buried layers 165 may be formed of, for example, metal or metal silicide. For example, the metal may be applied using a physical vapor deposition (PVD) method, and the metal silicide may be applied using a self-alignment formation method or a CVD method. The third semiconductor 162 and the buried layers 165 may together constitute second electrodes 160*a*.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A non-volatile memory device comprising:
   at least one first electrode;
   at least one second electrode crossing the at least one first electrode;
   at least one data storing layer interposed between the at least one first electrode and the at least one second electrode, at a region in which the at least one first electrode crosses the at least one second electrode;
   at least one metal silicide layer interposed between the at least one first electrode and the at least one second electrode, at a region in which the at least one first electrode crosses the at least one second electrode; and
   at least one junction layer interposed between the at least one first electrode and the at least one metal silicide layer, and the at least one first electrode comprises a first semiconductor having a first conductivity, and the at least one junction layer comprises a second semiconductor having a second conductivity which is opposite to the first conductivity, wherein the at least one junction layer is recessed in a sidewall of the at least one first electrode.

2. The non-volatile memory device of claim 1, wherein the at least one metal silicide layer is interposed between the at least one first electrode and the at least one data storing layer.

3. The non-volatile memory device of claim 1, wherein the at least one metal silicide layer is interposed between the at least one junction layer and the at least one second electrode.

4. The non-volatile memory device of claim 1, wherein the at least one second electrode comprises a metal.

5. The non-volatile memory device of claim 1, wherein the at least one first electrode and the at least one second electrode are arranged to cross each other at a right angle.

6. The non-volatile memory device of claim 1, wherein the data storing layer comprises a variable resistor.

7. A non-volatile memory device comprising:
   a plurality of first electrodes, wherein the plurality of the first electrodes are stacked as a plurality of stacked layers;

a plurality of second electrodes disposed between and crossing the plurality of the first electrodes;

at least one data storing layer interposed between the plurality of first electrodes and the plurality of second electrodes, at a region in which the plurality of first electrodes cross the plurality of second electrodes; and a plurality of metal silicide layers interposed between the plurality of first electrodes and the plurality of second electrodes, at a region in which the plurality of first electrodes cross the plurality of second electrodes, wherein the at least one data storing layer extends along the plurality of the first electrodes constituting the plurality of stacked layers.

* * * * *